(12) United States Patent
Han et al.

(10) Patent No.: US 9,334,357 B2
(45) Date of Patent: May 10, 2016

(54) AROMATIC RESINS FOR UNDERLAYERS

(71) Applicants: Rohm and Haas Electronic Materials LLC, Marlborough, MA (US); Rohm and Haas Electronic Materials Korea Ltd., Chungcheongnam-do (KR)

(72) Inventors: Seon-Hwa Han, Suwon (KR); Sung Wook Cho, Seoul (KR); Hae-Kwang Pyun, Gyeonggi-Do (KR); Jung-June Lee, Sin-dong (KR); Shintaro Yamada, Shrewsbury, MA (US)

(73) Assignees: Rohm and Haas Electronic Materials LLC, Marlborough, MA (US); Rohm and Haas Electronic Materials Korea Ltd. (KR)

( * ) Notice: Subject to any disclaimer, the term of this patent is extended or adjusted under 35 U.S.C. 154(b) by 0 days.

(21) Appl. No.: 14/701,463

(22) Filed: Apr. 30, 2015

(65) Prior Publication Data
US 2015/0315333 A1    Nov. 5, 2015

Related U.S. Application Data

(60) Provisional application No. 61/986,765, filed on Apr. 30, 2014.

(51) Int. Cl.
| | | |
|---|---|---|
| C08G 61/12 | (2006.01) |
| C09D 165/00 | (2006.01) |
| G03F 7/11 | (2006.01) |
| G03F 7/09 | (2006.01) |
| G03F 7/30 | (2006.01) |
| G03F 7/36 | (2006.01) |
| G03F 7/40 | (2006.01) |

(52) U.S. Cl.
CPC ............ *C08G 61/128* (2013.01); *C09D 165/00* (2013.01); *G03F 7/09* (2013.01); *G03F 7/091* (2013.01); *G03F 7/11* (2013.01); *G03F 7/30* (2013.01); *G03F 7/36* (2013.01); *G03F 7/40* (2013.01); *G03F 7/405* (2013.01); *C08G 2261/12* (2013.01); *C08G 2261/314* (2013.01)

(58) Field of Classification Search
None
See application file for complete search history.

(56) References Cited

U.S. PATENT DOCUMENTS

| | | | |
|---|---|---|---|
| 7,862,990 B2 | 1/2011 | Yoon et al. |
| 8,513,133 B2 | 8/2013 | Minegishi et al. |
| 2010/0021830 A1 | 1/2010 | Kim et al. |
| 2012/0171611 A1 | 7/2012 | Ideno et al. |
| 2013/0171569 A1 | 7/2013 | Tachibana et al. |
| 2014/0183701 A1* | 7/2014 | Choi ................. H01L 21/02282 257/618 |

FOREIGN PATENT DOCUMENTS

KR    20100080139 A    7/2010

* cited by examiner

Primary Examiner — Sin Lee
(74) Attorney, Agent, or Firm — S. Matthew Cairns

(57) ABSTRACT

Polymeric reaction products of certain aromatic alcohols with certain diaryl-substituted aliphatic alcohols are useful as underlayers in semiconductor manufacturing processes.

11 Claims, No Drawings

AROMATIC RESINS FOR UNDERLAYERS

The present invention relates generally to field of manufacturing electronic devices, and more specifically to the field of materials for use in semiconductor manufacture.

It is well-known in lithographic processes that a resist pattern can collapse due to surface tension from the developer used if the resist pattern is too tall (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, such as different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

Many attempts have been made to develop underlayer materials which possess desired antireflective properties and etch selectivity, and which are suitable for use with these multilayer processes. One feature of etch selectivity is the etch resistance of an organic material to plasma etches. It is generally desired in the industry to develop underlayer materials that have improved etch resistance as compared to conventional materials. Korean Pat. App. No. 2010080139 A discloses certain aromatic polymers formed from the self-condensation of pyrenol compounds in toluene (a non-polar solvent). Such aromatic polymers do not show desired etch selectivity, that is, etch resistance. U.S. Published Pat. App. No. 2010/0021830 discloses certain pyrene-containing aromatic polymers, but does not disclose polymers having certain fused aromatic ring moieties pendant from the polymer backbone. There remains a need for underlayer materials that possess desired antireflective properties and improved etch selectivity, particularly improved etch resistance to $O_2$ and $CF_4$ plasmas.

The present invention provides a polymeric reaction product of one or more first monomers of the formula (1)

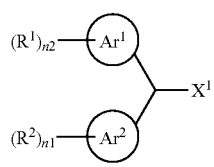

wherein $Ar^1$ and $Ar^2$ independently represent an aromatic moiety; $R^1$ and $R^2$ are independently selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^1$ is selected from OH, SH and $OR^3$; $R^3$ is $(C_1-C_{20})$alkyl; and each of n1 and n2 is an integer independently selected from 0 to 5; wherein $R^1$ and $R^2$ may be taken together to form a 5- to 7-membered fused ring; one or more second monomers of the formula (2)

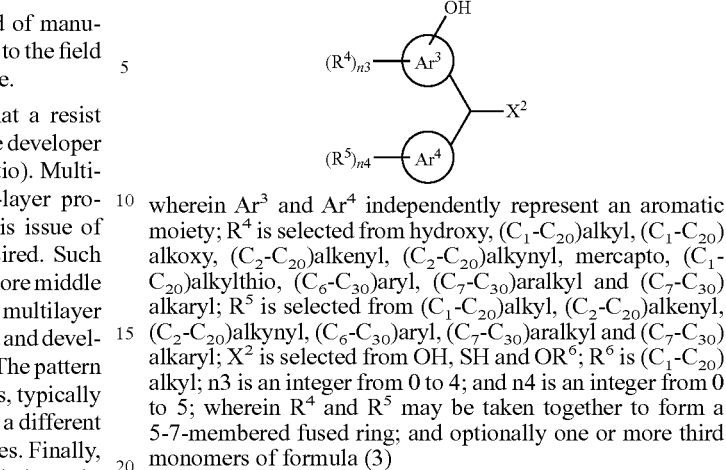

wherein $Ar^3$ and $Ar^4$ independently represent an aromatic moiety; $R^4$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^5$ is selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^2$ is selected from OH, SH and $OR^6$; $R^6$ is $(C_1-C_{20})$alkyl; n3 is an integer from 0 to 4; and n4 is an integer from 0 to 5; wherein $R^4$ and $R^5$ may be taken together to form a 5-7-membered fused ring; and optionally one or more third monomers of formula (3)

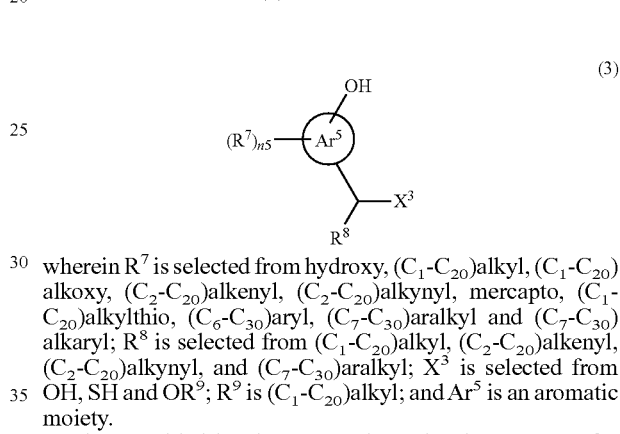

wherein $R^7$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^8$ is selected from $(C_1-C_{20})$alkyl, $(C_2-C_{20})$alkenyl, $(C_2-C_{20})$alkynyl, and $(C_7-C_{30})$aralkyl; $X^3$ is selected from OH, SH and $OR^9$; $R^9$ is $(C_1-C_{20})$alkyl; and $Ar^5$ is an aromatic moiety.

Also provided by the present invention is a process for preparing the polymeric reaction product described above comprising reacting one or more first monomers of the formula (1)

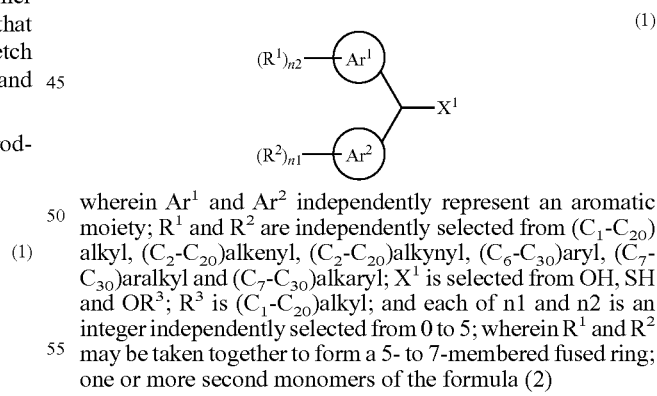

wherein $Ar^1$ and $Ar^2$ independently represent an aromatic moiety; $R^1$ and $R^2$ are independently selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^1$ is selected from OH, SH and $OR^3$; $R^3$ is $(C_1-C_{20})$alkyl; and each of n1 and n2 is an integer independently selected from 0 to 5; wherein $R^1$ and $R^2$ may be taken together to form a 5- to 7-membered fused ring; one or more second monomers of the formula (2)

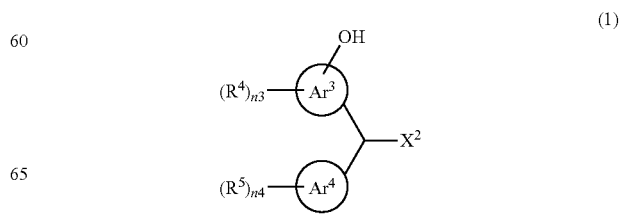

wherein $Ar^3$ and $Ar^4$ independently represent an aromatic moiety; $R^4$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^5$ is selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^2$ is selected from OH, SH and $OR^6$; $R^6$ is $(C_1-C_{20})$alkyl; n3 is an integer from 0 to 4; and n4 is an integer independently selected from 0 to 5; wherein $R^4$ and $R^5$ may be taken together to form a 5- to 7-membered fused ring; and optionally one or more third monomers of formula (3)

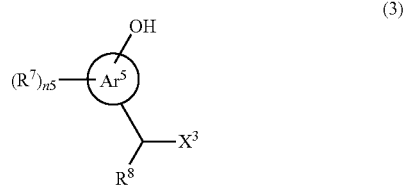

(3)

wherein $R^7$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^8$ is selected from $(C_1-C_{20})$alkyl, $(C_2-C_{20})$alkenyl, $(C_2-C_{20})$alkynyl, and $(C_7-C_{30})$aralkyl; $X^3$ is selected from OH, SH and $OR^9$; $R^9$ is $(C_1-C_{20})$alkyl; and $Ar^5$ is an aromatic moiety; in a solvent and in the presence of an acid. The present invention also provides a polymeric reaction product produced by the process described above.

Further, the present invention provides a composition comprising the polymeric reaction product described above, organic solvent, and optionally one or more additives chosen from curing agents, crosslinking agents, and surfactants.

The present invention also provides a process of forming a patterned layer comprising disposing a layer of the composition described above on a substrate; removing organic solvent to form a polymeric reaction product layer; disposing a layer of a photoresist on the polymeric reaction product layer; exposing the photoresist layer to actinic radiation through a mask; developing the exposed photoresist layer to form a resist pattern; and transferring the pattern to the polymeric reaction product layer to expose portions of the substrate.

As used herein, when an element is referred to as being "disposed on" another element, it can be directly disposed on the other element or intervening elements may be present therebetween. In contrast, when an element is referred to as being "directly disposed on" another element, there are no intervening elements present.

It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; ppm=part per million; μm=micron=micrometer; nm=nanometer; A=angstrom; L=liter; and mL=milliliter. All amounts are percent by weight and all ratios are molar ratios, unless otherwise noted. All numerical ranges are inclusive and combinable in any order, except where it is clear that such numerical ranges are constrained to add up to 100%. The abbreviation "wt %" refers to percent by weight, based on the total weight of a referenced composition, unless otherwise noted.

As used throughout the specification, "feature" refers to the geometries on a substrate, and particularly on a semiconductor wafer. The term "alkyl" includes linear, branched and cyclic alkyl. Likewise, "alkenyl" refers to linear, branched and cyclic alkenyl, and "alkynyl" refers to linear, branched and cyclic alkynyl. By the term "curing" it is meant any process, such as polymerization or condensation, that increases the molecular weight of a material or composition. "Curable" refers to any material capable of being cured (polymerized) under certain conditions. The term "oligomer" refers to dimers, trimers, tetramers and other relatively low molecular weight materials that are capable of further curing. The articles "a", "an" and "the" refer to the singular and the plural.

"Aryl" refers to an aromatic ring system, which may include aromatic carbocycles, aromatic heterocycles, and a mixture thereof. It is preferred that the aryl moiety is an aromatic carbocyclic system. Each aryl moiety suitable for use in the present invention comprises 1 or more aromatic rings, and preferably 2 or more fused aromatic rings. Preferably, at least one aryl moiety in each of formula (1) and formula (2) comprises 2 or more fused aromatic rings, and more preferably each aryl moiety comprises from 2 to 7 fused aromatic rings. It is further preferred that each aryl moiety comprises from 2 to 6 fused aromatic rings, and yet more preferably from 2 to 5 fused aromatic rings.

Polymeric reaction products of the invention are aromatic resins that are particularly suitable for use as underlayers in a variety of electronic device manufacturing processes. These resins are prepared by reacting one or more, and preferably one, first diaryl-substituted methane monomers, where the methane carbon is substituted with OH, SH or O-alkyl, and where each aryl moiety is free of substituents selected from OH, SH and O-alkyl, with one or more second diaryl-substituted methane monomers, where the methane carbon is substituted with OH, SH or O-alkyl, and where at least one aryl moiety is substituted with OH, SH or O-alkyl. The present aromatic resins are reaction products of one or more first monomers of the formula (1)

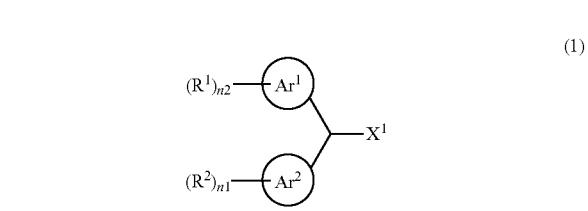

(1)

wherein $Ar^1$ and $Ar^2$ independently represent an aromatic moiety; $R^1$ and $R^2$ are independently selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^1$ is selected from OH, SH and $OR^3$; $R^3$ is $(C_1-C_{20})$alkyl; and each of n1 and n2 is an integer independently selected from 0 to 5; wherein $R^1$ and $R^2$ may be taken together to form a 5- to 7-membered fused ring; one or more second monomers of the formula (2)

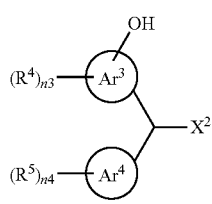

wherein $Ar^3$ and $Ar^4$ independently represent an aromatic moiety; $R^4$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^5$ is selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^2$ is selected from OH, SH and $OR^6$; $R^6$ is $(C_1-C_{20})$alkyl; n3 is an integer from 0 to 4 and n4 is an integer from 0 to 5; wherein $R^4$ and $R^5$ may be taken together to form a 5- to 7-membered fused ring; and optionally one or more third monomers of formula (3)

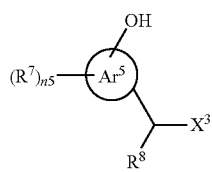

wherein $R^7$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^8$ is selected from $(C_1-C_{20})$alkyl, $(C_2-C_{20})$alkenyl, $(C_2-C_{20})$alkynyl, and $(C_7-C_{30})$aralkyl; $X^3$ is selected from OH, SH and $OR^9$; $R^9$ is $(C_1-C_{20})$alkyl; and $Ar^5$ is an aromatic moiety.

Compounds useful as the first monomers have the formula (1)

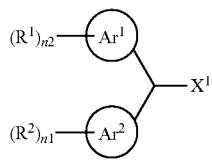

wherein $Ar^1$ and $Ar^2$ independently represent an aromatic moiety; $R^1$ and $R^2$ are independently selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^1$ is selected from OH, SH and $OR^3$; $R^3$ is $(C_1-C_{20})$alkyl; and each of n1 and n2 is an integer independently selected from 0 to 5; wherein $R^1$ and $R^2$ may be taken together to form a 5- to 7-membered fused ring. It is preferred that at least one of $Ar^1$ and $Ar^2$ represents an aromatic moiety having at least 2 fused aromatic rings, and more preferably that each of $Ar^1$ and $Ar^2$ represents an aromatic moiety having at least 2 fused aromatic rings. More preferably, both $Ar^1$ and $Ar^2$ independently represent an aromatic moiety having from 2 to 7 fused aromatic rings, yet more preferably from 2 to 6 fused aromatic rings, still more preferably from 2 to 5 fused aromatic rings, even more preferably from 2 to 4 fused aromatic rings, and yet even more preferably 2 fused aromatic rings. $Ar^1$ and $Ar^2$ may be the same or different, and preferably $Ar^1=Ar^2$. It is preferred that $R^1$ and $R^2$ are independently selected from $(C_1-C_{16})$alkyl, $(C_2-C_{16})$alkenyl, $(C_2-C_{16})$alkynyl, $(C_6-C_{30})$aryl, $(C_7-C_{30})$aralkyl and $(C_7-C_{30})$alkaryl, more preferably $(C_6-C_{30})$aryl. Preferably, $X^1$ is OH or SH, and more preferably OH. $R^3$ is preferably $(C_1-C_{16})$alkyl, more preferably $(C_1-C_{12})$alkyl, yet more preferably $(C_1-C_6)$alkyl, and even more preferably $(C_1-C_3)$alkyl. Each of n1 and n2 are preferably an integer independently selected from 0 to 4, more preferably from 0 to 3, still more preferably from 0 to 2, yet more preferably 0 or 1, and even more preferably 0. $R^1$ and $R^2$ may be taken together to form a 5- to 7-membered fused ring, and preferably a 5- to 6-membered fused ring. When taken together, one $R^1$ and one $R^2$ may be taken together to form a chemical bond to form a fused non-aromatic ring, examples of which are shown in formulae (1a) to (1c), or two of $R^1$ and two of $R^2$ may be taken together to form a ring, which may be aromatic or non-aromatic, that is fused to both $Ar^1$ and $Ar^2$, an example of which is shown in formulae (1d).

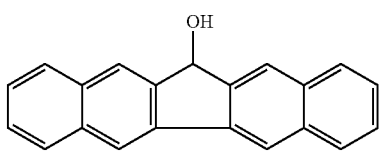

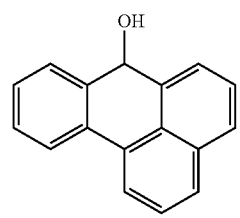

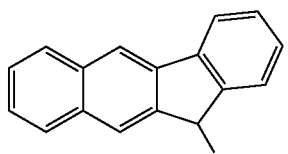

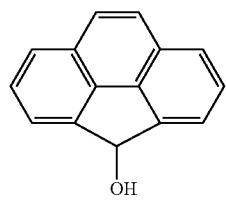

Compounds useful as the second monomers have the formula (2)

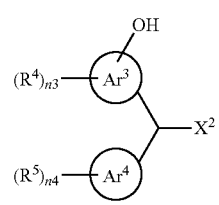

wherein $Ar^3$ and $Ar^4$ independently represent an aromatic moiety; $R^4$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^5$ is selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^2$ is selected from OH, SH and $OR^6$; $R^6$ is $(C_1-C_{20})$alkyl; n3 is an integer from 0 to 4; and n4 is an integer from 0 to 5; wherein $R^4$ and $R^5$ may be taken together to form a 5- to 7-membered fused ring. Preferably, at least one of $Ar^3$ and $Ar^4$ is an aromatic moiety having 2 or more fused aromatic rings, and preferably from 2 to 7 fused aromatic tings. It is more preferred that $Ar^3$ and $Ar^4$ independently represent an aromatic moiety having from 2 to 7 fused aromatic rings, more preferably from 2 to 6 fused aromatic rings, still more preferably from 2 to 5 fused aromatic rings, yet more preferably from 2 to 4 fused aromatic rings, and even more preferably 2 fused aromatic rings. Preferably, at least one of $Ar^3$ and $Ar^4$ represents an aryl moiety having at least 4 fused aromatic rings. $Ar^3$ and $Ar^4$ may be the same or different, and preferably $Ar^3 \neq Ar^4$. It is preferred that $R^4$ is selected from hydroxy, $(C_1-C_{16})$alkyl, $(C_1-C_{16})$alkoxy, $(C_2-C_{16})$alkenyl, $(C_2-C_{16})$alkynyl, mercapto, $(C_1-C_{16})$alkylthio, $(C_6-C_{30})$aryl, $(C_7-C_{30})$aralkyl and $(C_7-C_{30})$alkaryl. It is preferred that $R^5$ is selected from $(C_1-C_{16})$alkyl, $(C_2-C_{16})$alkenyl, $(C_2-C_{16})$alkynyl, $(C_6-C_{30})$aryl, $(C_7-C_{30})$aralkyl and $(C_7-C_{30})$alkaryl. Preferably, $X^2$ is OH or SH, and more preferably OH. $R^6$ is preferably $(C_1-C_{16})$alkyl, more preferably $(C_1-C_{12})$alkyl, yet more preferably $(C_1-C_6)$alkyl, and even more preferably $(C_1-C_3)$alky. It is preferred that n3 is an integer selected from 0 to 3, more preferably 0 to 2, yet more preferably 0 or 1, and even more preferably 0. It is preferred that n4 is an integer independently selected from 0 to 3, more preferably from 0 to 2, yet more preferably 0 or 1, and even more preferably 0. $R^4$ and $R^5$ may be taken together to form a 5- to 7-membered fused ring, and preferably a 5- to 6-membered fused ring. When taken together, one $R^4$ and one $R^5$ may form a chemical bond to form a non-aromatic fused ring, or two of $R^4$ and two of $R^5$ may form a ring that is fused to both $Ar^3$ and $Ar^4$, such fused ring may be aromatic or non-aromatic.

Exemplary aromatic moieties for $Ar^1$, $Ar^2$, $Ar^3$ and $Ar^4$ include, without limitation, benzene, naphthalene, anthracene, phenanthrene, pyrene, tetracene, tetraphene, benzo[f]tetraphene, benzo[m]tetraphene, benzo[k]tetraphene, pentacene, perylene, benzo[a]pyrene, benzo[e]pyrene, benzo[ghi]perylene, coronene, quinolone, 7,8-benzoquinoline, and 12H-dibenzo[b,h]fluorene. Preferred aromatic moieties are naphthalene, anthracene, phenanthrene, pyrene, tetracene, tetraphene, pentacene, perylene, benzo[g,h,i]perylene, and coronene. It is more preferred that both $Ar^1$ and $Ar^2$ are selected from naphthalene, anthracene, phenanthrene, and pyrene, and even more preferably naphthalene and pyrene. It is more preferred that $Ar^3$ and $Ar^4$ are independently chosen from naphthalene, anthracene, phenanthrene, and pyrene, and even more preferably that one of $Ar^3$ and $Ar^4$ is pyrene. Yet more preferably, $Ar^3$ is selected from naphthalene and pyrene. It is further preferred that $Ar^4$ is selected from naphthalene and pyrene. Even more preferably, $Ar^3$ and $Ar^4$ are selected from naphthalene and pyrene, and $Ar^3 \neq Ar^4$.

Optionally, one or more third monomers of formula (3) may be used in the present reaction products

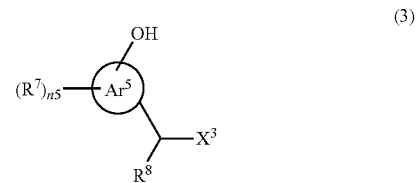

(3)

wherein $R^7$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^8$ is selected from $(C_1-C_{20})$alkyl, $(C_2-C_{20})$alkenyl, $(C_2-C_{20})$alkynyl, and $(C_7-C_{30})$aralkyl; $X^3$ is selected from OH, SH and $OR^9$; $R^9$ is $(C_1-C_{20})$alkyl; and $Ar^5$ is an aromatic moiety. Any of the aromatic moieties described above for $Ar^1$ to $Ar^4$ may suitably be used for $Ar^5$. Preferably, $R^8$ is selected from $(C_1-C_{20})$alkyl, $(C_2-C_{20})$alkenyl, $(C_2-C_{20})$alkynyl, and $(C_7-C_{30})$aralkyl. $R^9$ is preferably $(C_1-C_6)$alkyl, and more preferably $(C_1-C_3)$alkyl.

The present polymeric reaction products are prepared by reacting one or more, and preferably one, first monomers of formula (1) described above with one or more second monomers of formula (2) described above, and optionally with one or more third monomers of formula (3), in a suitable solvent in the presence of an acid catalyst. The monomers and solvent may be combined in any order. Acid catalyst is typically added to the reaction mixture after the monomers and solvent. Preferably, the reaction mixture is heated, such as from room temperature to 50° C. before addition of the acid catalyst. Following addition of the acid catalyst, the reaction mixture is typically heated, such as at reflux, for a period of time, such as from 1 to 48 hours. Following heating, the polymeric reaction product is isolated from the reaction mixture, such as by precipitation, and is typically dried, and optionally purified, before use. If purification is desired, any suitable purification method known in the art method may be used, such as precipitation, extraction, chromatography, and the like.

A variety of solvents may be used to prepare the present aromatic resin reaction products, such as, but not limited to, alcohols, glycol ethers, lactones, esters, water, and aromatic hydrocarbons. Preferably, a relatively polar solvent is used, such as alcohols, glycol ethers, lactones, esters or water. Mixtures of solvents may be used. It is preferred that at least one relatively polar solvent be used in the solvent mixture. Exemplary solvents include, without limitation, methanol, ethanol, propanol, propylene glycol, propylene glycol methyl ether (PGME), propylene glycol dimethyl ether, diethylene glycol dimethyl ether, propylene glycol methyl ether acetate (PGMEA), gamma-butyrolactone (GBL), gamma-valerolactone, delta-valerolactone, ethyl lactate, water, mesitylene, xylene, anisole, 4-methylanisole, and the like. Preferred solvents are methanol, ethanol, propanol, propylene glycol, propylene glycol methyl ether, propylene glycol dimethyl ether, propylene glycol methyl ether acetate, gamma-butyrolactone, gamma-valerolactone, delta-valerolactone, ethyl lactate, and water.

A variety of acids may suitably be used as catalysts in the preparation of the present aromatic resin reaction products. Such acids typically have a pKa of ≤2, preferably ≤1.5, more preferably ≤1, and yet more preferably ≤0. Exemplary acids include, without limitation, organic carboxylic acids and dicarboxylic acids such as propionic acid and oxalic acid, mineral acids and sulfonic acids, and preferably the acid catalysts is a mineral acid or a sulfonic acid. Suitable mineral acids are HF, HCl, HBr, $HNO_3$, $H_2SO_4$, $H_3PO_4$, and $HClO_4$.

Suitable sulfonic acids include alkanesulfonic acids and arylsulfonic acids, such as methanesulfonic acid, ethanesulfonic acid, propanesulfonic acid, phenylsulfonic acid, phenolsulfonic acid, para-toluenesulfonic acid, and cresolsulfonic acid. Preferred acid catalysts are HCl, HBr, $HNO_3$, $H_2SO_4$, $H_3PO_4$, methanesulfonic acid, ethanesulfonic acid, phenylsulfonic acid, phenolsulfonic acid, and para-toluenesulfonic acid (pTSA).

The present aromatic resin reaction products have a relatively low weight average molecular weight ($M_w$) as compared to aromatic resins prepared using conventional methods. While not wishing to be bound by theory, it is believed that the use of the first monomers of formula (1) function to provide relatively smaller aromatic resins, that is, relatively lower molecular weight aromatic resins, as compared to similar reactions that do not use monomers of formula (1). The aromatic resin reaction products of the invention have a $M_w$ of 500 to 15000, preferably from 500 to 10000, and more preferably from 500 to 5000, as determined by gel permeation chromatography (GPC) using polystyrene standards. The present aromatic resin reaction products have a polydispersity ($M_w/M_n$) of from 1.1 to 5, and preferably of from 1.1 to 3, where $M_n$ is the number average molecular weight.

A suitable composition useful for forming an underlayer comprises one or more aromatic resin reaction products described above, organic solvent, and optionally one or more additives chosen from curing agents, crosslinking agents, and surfactants. Mixtures of the present aromatic resin reaction products may be used in the present compositions. It will be appreciated by those skilled in the art that other additives may suitably be used in the present compositions. Any solvent may be used, provided that a sufficient amount of the aromatic resin reaction product is soluble in solvent, or solvent mixture, used. Such solvents include, but are not limited to, aromatic hydrocarbons, alcohols, lactones, esters, glycols, and glycol ethers. Mixtures of organic solvents may be used. Exemplary organic solvents include, without limitation, toluene, xylene, mesitylene, 2-methyl-1-butanol, 4-methyl-2-pentanol, methyl isobutyl carbinol, gamma-butyrolactone, ethyl lactate, methyl 2-hydroxyisobutyrate, propylene glycol methyl ether acetate, propylene glycol methyl ether, and cyclohexanone. It will be appreciated by those skilled in the art that the concentration of the aromatic resin reaction products in the solvent may be varied across a wide range and that the thickness of any film deposited by a spin-on technique depends on the concentration of the reaction products in the solvent.

Optionally, the present aromatic resin compositions may further comprise one or more curing agents to aid in the curing of the deposited aromatic resin film. A curing agent is any component which causes curing of an aromatic resin film on the surface of a substrate. Preferred curing agents are thermal acid generators. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators. The amount of such curing agents useful in the present compositions is well-known to those skilled in the art and is typically from 0 to 10 wt %, and preferably from 0 to 3 wt %.

Any suitable crosslinking agent may be used in the present compositions, provided that such crosslinking agent has at least 2, and preferably at least 3, moieties capable of reacting with the present aromatic resin reaction products under suitable conditions, such as under acidic conditions. Exemplary crosslinking agents include, but are not limited to, novolac resins, epoxy-containing compounds, melamine compounds, guanamine compounds, isocyanate-containing compounds, benzocyclobutenes, and the like, and preferably any of the foregoing having 2 or more, preferably 3 or more, and more preferably 4, substituents selected from methylol, $C_1$-$C_{10}$alkoxymethyl, and $C_2$-$C_{10}$acyloxymethyl. Examples of suitable crosslinking agents are those shown by formulae (4) and (5).

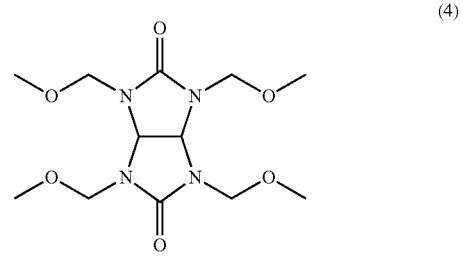

(4)

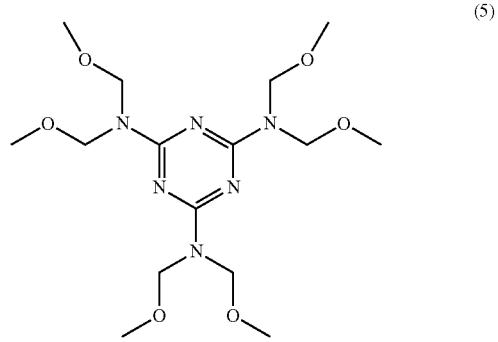

(5)

Such crosslinking agents are well-known in the art, and are commercially available from a variety of sources. The amount of such crosslinking agents useful in the present compositions is well-known to those skilled in the art, and typically is in the range of 0 to 30 wt %, and preferably from 0 to 10 wt %.

The present aromatic resin compositions may optionally include one or more surface leveling agents (or surfactants). While any suitable surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. The amount of such surfactants useful in the present compositions is well-known to those skilled in the art, and typically is in the range of 0 to 5 wt %.

The present aromatic resin reaction products are useful in the manufacture of various electronic devices, such as in a process of forming a patterned layer comprising disposing a layer of the composition described above on a substrate; removing organic solvent to form a polymeric reaction product layer; disposing a layer of a photoresist on the polymeric reaction product layer; exposing the photoresist layer to actinic radiation through a mask; developing the exposed photoresist layer to form a resist pattern; and transferring the pattern to the polymeric reaction product layer to expose portions of the substrate.

The present compositions may be disposed on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15-90 seconds to obtain a desired layer of the aromatic resin reaction product on the substrate. It will be appreciated by those skilled in the art that the height of the aromatic resin layer may be adjusted by changing the spin speed.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size, such as wafers having a diameter of 200 mm to 300 mm. As used herein, the term "semiconductor substrate" includes any substrate having one or more semiconductor layers or structures which include active or operable portions of semiconductor devices. A semiconductor device refers to a semiconductor substrate upon which at least one microelectronic device has been or is being batch fabricated.

After being deposited on the substrate, the aromatic resin underlayer is optionally baked at a relatively low temperature to remove any solvent and other relatively volatile components from the underlayer. Typically, the substrate is baked at a temperature of ≤150° C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate.

The aromatic resin underlayer is then sufficiently cured such that the film does not intermix with a subsequently applied organic layer, such as a photoresist or other organic layer disposed directly on the underlayer. The aromatic resin underlayer may be cured in an oxygen-containing atmosphere, such as air, or in an inert atmosphere, such as nitrogen and under conditions, such as heating, sufficient to provide a cured aromatic resin underlayer. Such conditions are sufficient to cure the film such that it does not intermix with a subsequently applied organic layer, such as a photoresist layer, while still maintaining the desired antireflective properties (n and k values) and etch selectivity of the underlayer film. This curing step is conducted preferably on a hot plate-style apparatus, though oven curing may be used to obtain equivalent results. Typically, such curing is performed by heating the aromatic resin layer at a curing temperature of ≥150° C., and preferably 150 to 450° C. It is more preferred that the curing temperature is ≥200° C., still more preferably ≥250° C., and even more preferably from 250 to 400° C. The curing temperature selected should be sufficient to cure the aromatic resin underlayer. When a thermal acid generator is used, the curing temperature should be sufficient for the thermal acid generator to liberate acid to aid in curing of the aromatic resin. The curing time may be from 10 seconds to 10 minutes, preferably from 30 seconds to 5 minutes, more preferably from 45 seconds to 5 minutes, and yet more preferably from 45 to 90 seconds. The choice of final curing temperature depends mainly upon the desired curing rate, with higher curing temperatures requiring shorter curing times.

The initial baking step may not be necessary if the curing step is conducted in such a way that rapid evolution of the solvents and curing by-products is not allowed to disrupt the film quality. For example, a ramped bake beginning at relatively low temperatures and then gradually increasing to the range of 200 to 325° C. can give acceptable results. It can be preferable in some cases to have a two-stage curing process, with the first stage being a lower bake temperature of less than 200° C., and the second stage being a higher bake temperature preferably between 200 and 400° C. Two stage curing processes facilitate uniform filling and planarization of pre-existing substrate surface topography, for example filling of trenches and vias.

After curing of the aromatic resin underlayer, one or more processing layers, such as photoresists, silicon-containing layers, hardmask layers, bottom antireflective coating (or BARC) layers, and the like, may be disposed on the cured underlayer. For example, a photoresist may be disposed, such as by spin coating, directly on the surface of the cured aromatic resin underlayer. A wide variety of photoresists may be suitably used, such as those used in 193 nm lithography, such as those sold under the EPIC™ brand available from Dow Electronic Materials (Marlborough, Mass.). Suitable photoresists may be either positive tone development or negative tone development resists. Following coating on the aromatic resin underlayer, the photoresist layer is then imaged (exposed) using patterned actinic radiation, and the exposed photoresist layer is then developed using the appropriate developer to provide a patterned photoresist layer. The pattern is next transferred from the photoresist layer to the underlayer by an appropriate etching technique. Typically, the photoresist is also removed during such etching step. Next, the pattern is transferred to the substrate and the underlayer removed by appropriate etching techniques known in the art, such as by plasma etching. Following patterning of the substrate, the underlayer is removed using conventional techniques. The electronic device substrate is then processed according to conventional means.

Alternatively, the cured aromatic resin underlayer may be used as the bottom layer of a multilayer resist process. In such a process, a layer of the aromatic resin reaction product is disposed on a substrate and cured as described above. Next, one or more middle layers are disposed on the aromatic resin underlayer. For example, a silicon-containing layer or a hardmask layer is disposed directly on the aromatic resin underlayer. Exemplary silicon-containing layers include a silicon-BARC, which may be spin coated on the underlayer followed by curing, or an inorganic silicon layer such as SiON or $SiO_2$ which may be deposited on the underlayer by chemical vapor deposition (CVD). Any suitable hardmask may be used and may be deposited on the underlayer by any suitable technique, and cured as appropriate. Optionally, an organic BARC layer may be disposed directly on the silicon-containing layer or hardmask layer, and appropriately cured. Next, a photoresist, such as those used in 193 nm lithography, is disposed directly on the silicon-containing layer (in a trilayer process) or directly on the organic BARC layer (in a quad-layer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the aromatic resin underlayer is then patterned using appropriate etching techniques, such as $O_2$ or $CF_4$ plasma. Any remaining patterned photoresist and organic BARC layers are removed during etching of the aromatic resin underlayer. Next, the pattern is then transferred to the substrate, such as by appropriate etching techniques, which also removes any remaining silicon-containing layer or hardmask layer, followed by removal of any remaining patterned aromatic resin underlayer to provide a patterned substrate.

Aromatic reaction products of the invention may also be used in a self-aligned double patterning process. In such a process, a layer of an aromatic resin reaction product described above is disposed on a substrate, such as by spin-coating. Any remaining organic is removed and the aromatic resin layer is cured to form an aromatic resin underlayer. A layer of a suitable photoresist is then disposed on the cured aromatic resin underlayer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the aromatic resin underlayer by an appropriate etching technique to expose portions of the substrate. Typically, the photoresist is also removed during such etching step. Next, a conformal silicon-containing layer is disposed over the patterned polymeric reaction product layer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the underlayer pattern. Next, the silicon-containing layer is partially etched (trimmed) to expose a top surface of the patterned aromatic resin underlayer and a portion of the substrate. Following this partial etching step, the pattern on the substrate comprises a plurality of features, each feature comprising a line or post of the aromatic resin underlayer with the silicon-containing layer directly adjacent to the sides of each aromatic resin underlayer feature. Next, the aromatic resin underlayer is removed, such as by etching, to expose the substrate surface that was under the aromatic resin underlayer pattern, and providing a patterned silicon-containing layer on the substrate surface, where such patterned silicon-containing layer is doubled (that is, twice as many lines and/or posts) as compared to the patterned aromatic resin underlayer.

The present polymeric aromatic resin reaction products provide underlayers having improved etch resistance to oxygen and fluorine gases, high carbon content, reduced or no swelling from exposure to processing fluids, and very good planarization and gap filling properties, making such reaction products useful in a variety of semiconductor manufacturing processes.

EXAMPLE 1

First monomer (1e) (0.3 g, 0.0011 mol), second monomer (2a) (4.0 g, 0.011 mol), pTSA (0.09 g, 0.0005 mol), and 18 mL of PGME were added to a three-necked round bottom flask equipped with a magnetic stir bar and condenser. The mixture was then stirred for 8 hours at 90° C. The reaction mixture was then cooled to room temperature and the aromatic resin reaction product (Sample 1) was precipitated with a mixture of methanol (230 mL) and DI water (18 mL). The precipitate was filtered and dried in a vacuum oven.

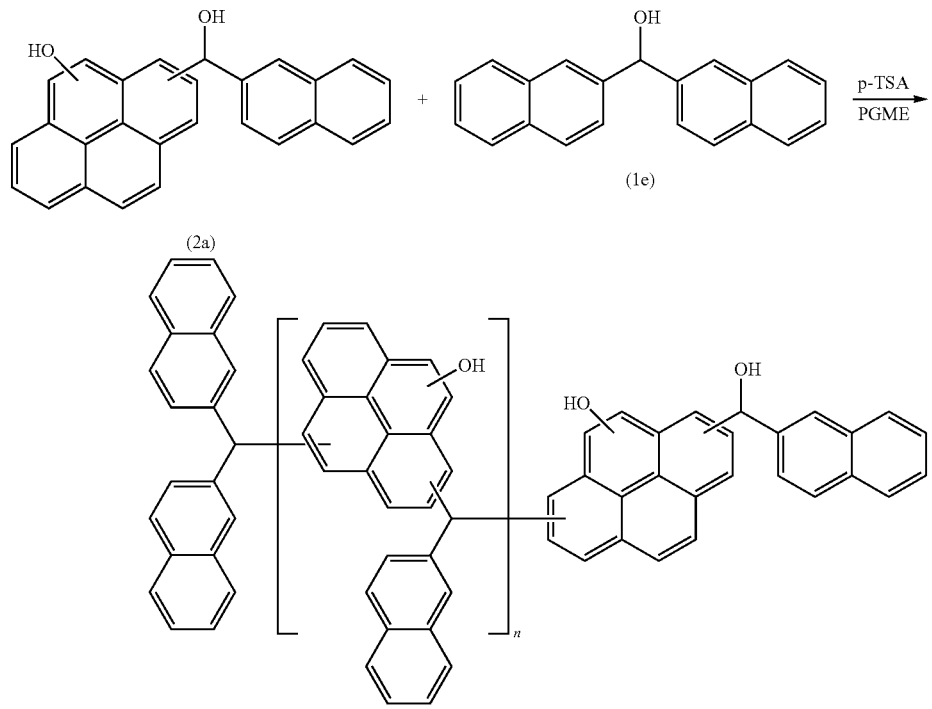

(Sample 1)

The reaction product (Sample 1) was analyzed by GPC and found to have an $M_w$ of 2505, a number average molecular weight ($M_n$) of 1787, and a polydispersity of 1.40.

Comparative Example 1

A sample (Comparative 1) of a polymer having the repeating unit shown in formula (6) was obtained from Gun Ei Chemical, and was used as is. The molecular weight of this sample was: $M_w$=6066, and $M_n$=2362.

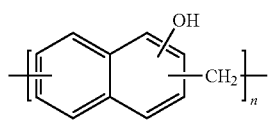

(6)

Comparative Example 2

Monomer (2a) (4.40 g, 0.0118 mol), pTSA (0.1 g, 0.0006 mol), and PGME (18 mL) were added to a three-necked round bottom flask equipped with a magnetic stir bar, condenser. The mixture was then stirred for 7 hours at 90° C. The reaction mixture was then cooled to room temperature and the aromatic resin reaction product (Comparative 2) was precipitated with a mixture of methanol (252 mL) and DI water (20 mL). The precipitate (Comparative 2) was filtered and dried in a vacuum oven. Comparative 2 was analyzed by GPC and found to have an $M_w$ of 2726, a number average molecular weight ($M_a$) of 1920, and a polydispersity of 1.42.

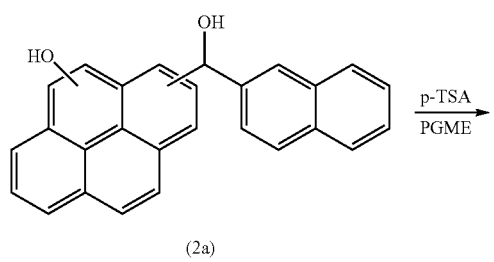

(2a)

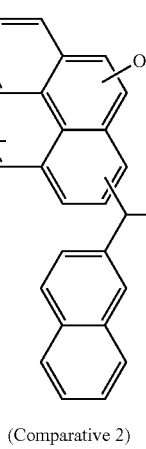

(Comparative 2)

EXAMPLE 2

The procedure of Example 1 is repeated except that the following first monomer (2f) and second monomer (2b) are used in the same relative molar amounts, with pTSA as the acid catalyst, to prepare Sample 2.

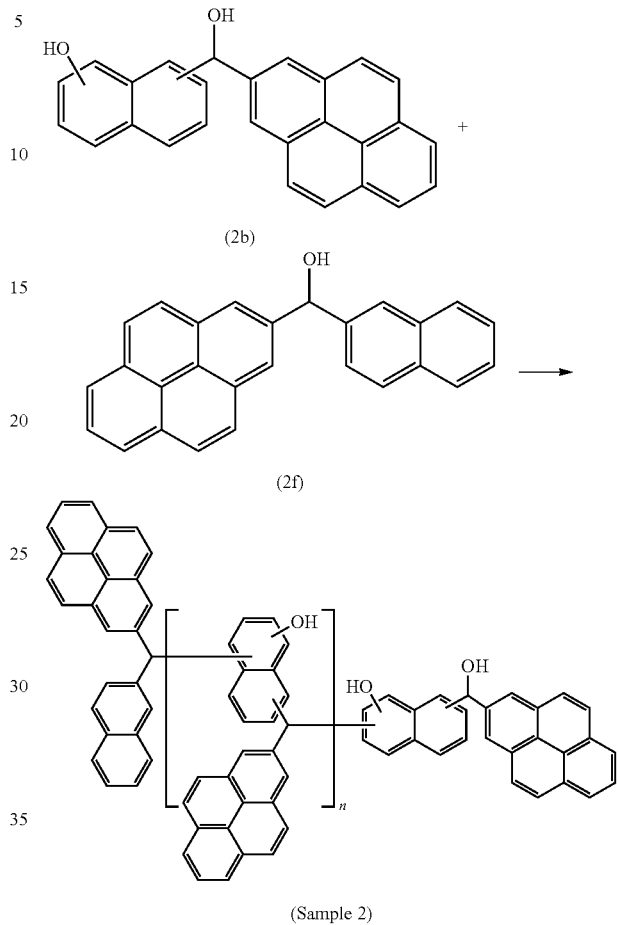

(2b)

(2f)

(Sample 2)

EXAMPLE 3

The procedure of Example 1 is repeated except that the following first monomer (1e) and second monomer (2b) are used in the same relative molar amounts, with pTSA as the acid catalyst, to prepare Sample 3.

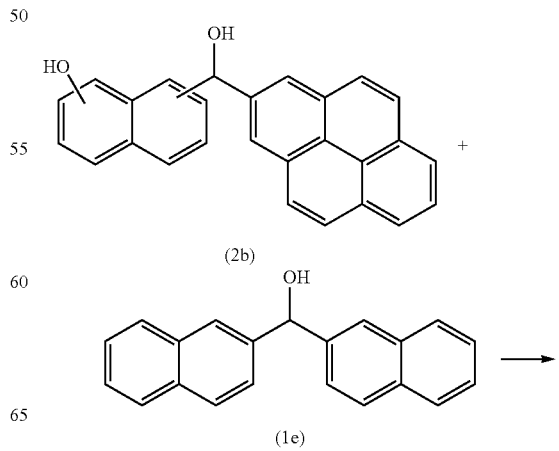

(2b)

(1e)

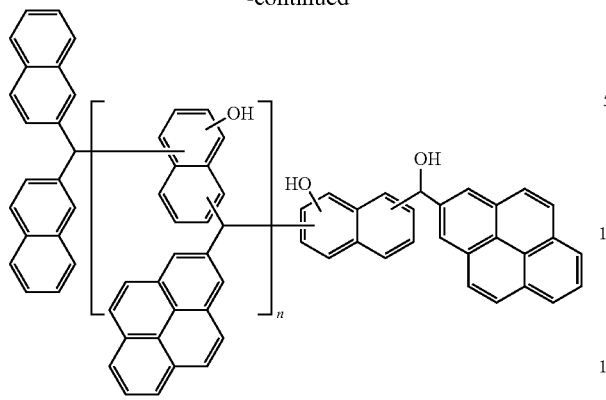

(Sample 3)

EXAMPLE 4

The procedure of Example 1 is repeated except that the following first monomer (1f) and second monomer (2a) are used in the same relative molar amounts, with pTSA as the acid catalyst, to prepare Sample 4.

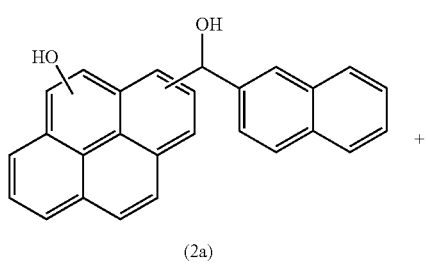

(2a)

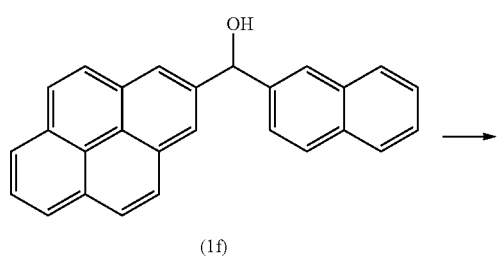

(1f)

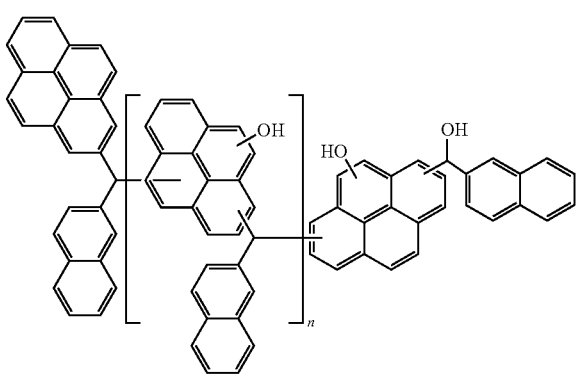

(Sample 4)

EXAMPLE 5

The procedure of Example 1 is repeated except that the following first monomer (1a) is used to prepare Sample 5.

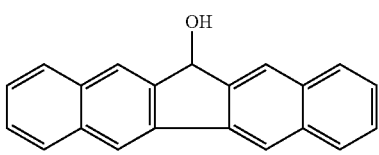
(1a)

EXAMPLE 5

The procedure of Example 1 is repeated except that the following first monomer (1d) is used to prepare Sample 6.

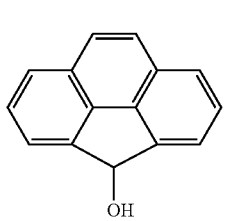
(1d)

EXAMPLE 6

The procedure of Example 1 is repeated except that the first and second monomers are replaced with those reported in Tables 1 and 2, to produce the Samples in Table 3.

TABLE 1

| First Monomer | $Ar^1$ | $Ar^2$ | $R^1$ | $R^2$ | n1 | n2 | $X^1$ |
|---|---|---|---|---|---|---|---|
| 1g | Benzene | Naphthalene | — | — | 0 | 0 | OH |
| 1h | Benzene | Phenanthrene | — | — | 0 | 0 | OH |
| 1i | Benzene | Benzene | — | — | 0 | 0 | OH |
| 1j | Pyrene | Pyrene | — | — | 0 | 0 | OH |
| 1k | Pyrene | Anthracene | — | — | 0 | 0 | $OCH_3$ |
| 1l | Pyrene | Naphthalene | — | Phenyl | 1 | 0 | OH |
| 1m | Coronene | Naphthalene | — | — | 0 | 0 | OH |
| 1n | Pyrene | Benzene | — | Phenyl | 1 | 0 | OH |

TABLE 2

| Second Monomer | Ar³ | Ar⁴ | R⁴ | R⁵ | n3 | n4 | X² |
|---|---|---|---|---|---|---|---|
| 2c | Benzene | Phenanthrene | — | — | 0 | 0 | OH |
| 2d | Naphthalene | Naphthalene | OH | — | 1 | 0 | OH |
| 2e | Pyrene | Pyrene | — | — | 0 | 0 | OH |
| 2f | Pyrene | Pyrene | OH | — | 1 | 0 | OH |
| 2g | Anthracene | Pyrene | — | — | 0 | 0 | OH |
| 2h | Pyrene | Naphthalene | — | Phenyl | 1 | 0 | OH |
| 2i | Naphthalene | Perylene | — | — | 0 | 0 | OH |
| 2j | Anthracene | Benzene | — | Phenyl | 1 | 0 | OH |
| 2k | Naphthalene | Pyrene | Phenyl | — | 0 | 1 | OH |
| 2l | Pyrene | Naphthalene | — | Biphenyl | 0 | 1 | OH |

EXAMPLE 7

The procedure of Example 6 is repeated to prepare the Samples listed in Table 3.

TABLE 3

| First Monomer | Second Monomer | Sample |
|---|---|---|
| 1f | 2h | 7 |
| 1a | 2l | 8 |
| 1c | 2e | 9 |
| 1j | 2c | 10 |
| 1j | 2e | 11 |
| 1n | 2l | 12 |
| 1b | 2b | 13 |
| 1e | 2i | 14 |
| 1e | 2l | 15 |
| 1j | 2h | 16 |

EXAMPLE 8

The aromatic resin reaction products listed in Table 5 were individually formulated in propyleneglycol monomethylether acetate (PGMEA) or cyclohexanone at 10 wt % solids, filtered through 0.2 μm poly(tetrafluoroethylene) (PTFE) syringe filter, coated on a silicon wafer at 1500 rpm and baked at 100° C. for 60 seconds to remove the solvent, and further cured at 400° C. for 60 seconds. The cured films were etched using either $O_2$ or $CF_4$ plasma using a Plasmatherm RIE790 tool (from Plasma-Therm Co.) and the conditions shown in Table 4. The etching data, in Å/sec., are reported in Table 5.

TABLE 4

| Gas | $O_2$ | $CF_4$ |
|---|---|---|
| Flow (sccm) | 60 | 50 |
| Power (W) | 700 | 500 |
| Pressure (mTorr) | 10 | 10 |
| Etch time (sec.) | 30 | 60 |

TABLE 5

| Sample | $O_2$ Etch-Å/sec. | $CF_4$ Etch-Å/sec. |
|---|---|---|
| 1 | 24.2 | 4.7 |
| Comparative 1 | 32.0 | 5.0 |
| Comparative 2 | 27.4 | 3.5 |

What is claimed is:

1. A polymeric reaction product of one or more first monomers of the formula (1)

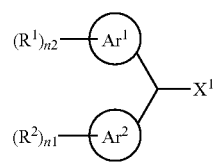

(1)

wherein $Ar^1$ and $Ar^2$ independently represent an aromatic moiety; $R^1$ and $R^2$ are independently selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^1$ is selected from OH, SH and $OR^3$; $R^3$ is $(C_1-C_{20})$alkyl; and each of n1 and n2 is an integer independently selected from 0 to 5; wherein $R^1$ and $R^2$ may be taken together to form a 5- to 7-membered fused ring; one or more second monomers of the formula (2)

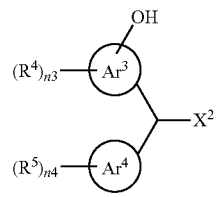

(2)

wherein $Ar^3$ and $Ar^4$ independently represent an aromatic; $R^4$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-C_{20})$alkylthio, $(C_6-C_{30})$aryl, $(C_7-C_{30})$aralkyl and $(C_7-C_{30})$alkaryl; $R^5$ is selected from $(C_1-C_{20})$alkyl, $(C_2-C_{20})$alkenyl, $(C_2-C_{20})$alkynyl, $(C_6-C_{30})$aryl, $(C_7-C_{30})$aralkyl and $(C_7-C_{30})$alkaryl; $X^2$ is selected from OH, SH and $OR^6$; $R^6$ is $(C_1-C_{20})$alkyl; n3 is an integer from 0 to 4; and n4 is an integer from 0 to 5; wherein $R^4$ and $R^5$ may be taken together to form a 5- to 7-membered fused ring; and optionally one or more third monomers of formula (3)

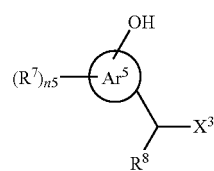

(3)

wherein $R^7$ is selected from hydroxy, $(C_1-C_{20})$alkyl, $(C_1-C_{20})$alkoxy, $(C_2-C_{20})$alkenyl, $(C_2-C_{20})$alkynyl, mercapto, $(C_1-$ $C_{20}$)alkylthio, ($C_6$-$C_{30}$)aryl, ($C_7$-$C_{30}$)aralkyl and ($C_7$-$C_{30}$) alkaryl; $R^8$ is selected from ($C_1$-$C_{20}$)alkyl, ($C_2$-$C_{20}$)alkenyl, ($C_2$-$C_{20}$)alkynyl, and ($C_7$-$C_{30}$)aralkyl; $X^3$ is selected from OH, SH and $OR^9$; $R^9$ is ($C_1$-$C_{20}$)alkyl; and $Ar^5$ is an aromatic moiety.

2. The polymeric reaction product of claim 1 wherein $Ar^1$ is the same as $Ar^2$.

3. The polymeric reaction product of claim 1 wherein $Ar^3$ is different from $Ar^4$.

4. The polymeric reaction product of claim 3 wherein $Ar^3$ represents an aryl moiety having from 3 to 7 fused aromatic rings and $Ar^4$ represents an aryl moiety having from 2 to 4 fused aromatic rings.

5. The polymeric reaction product of claim 1 wherein at least one of $Ar^3$ and $Ar^4$ represents an aryl moiety having at least 4 fused aromatic rings.

6. The polymeric reaction product of claim 1 wherein each of n1 and n2 is independently selected from 0 to 2.

7. A method of making the polymeric reaction product of claim 1 comprising reacting the one or more first monomers with the one or more second monomers in the presence of an acid catalyst in an organic solvent.

8. A composition comprising the polymeric reaction product of claim 1, organic solvent, and optionally one or more additives chosen from curing agents, crosslinking agents, and surfactants.

9. A process of forming a patterned layer comprising disposing a layer of the composition of claim 8 on a substrate; removing organic solvent to form a polymeric reaction product layer; disposing a layer of a photoresist on the polymeric reaction product layer; exposing the photoresist layer to actinic radiation through a mask; developing the exposed photoresist layer to form a resist pattern; and transferring the pattern to the polymeric reaction product layer to expose portions of the substrate.

10. The process of claim 9 further comprising the steps of patterning the substrate; and then removing the patterned polymeric reaction product layer.

11. The process of claim 9 further comprising the steps of disposing a conformal silicon-containing layer over the patterned polymeric reaction product layer and exposed portions of the substrate; partially etching the silicon-containing layer to expose a top surface of the patterned polymeric reaction product layer and a portion of the substrate.

* * * * *